(12) United States Patent
Fu et al.

(10) Patent No.: US 8,802,578 B2
(45) Date of Patent: Aug. 12, 2014

(54) METHOD FOR FORMING TIN BY PVD

(75) Inventors: Zuozhen Fu, Beijing (CN); Huaxiang Yin, Beijing (CN); Jiang Yan, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 166 days.

(21) Appl. No.: 13/695,191

(22) PCT Filed: Jul. 26, 2012

(86) PCT No.: PCT/CN2012/079176
§ 371 (c)(1),
(2), (4) Date: Oct. 29, 2012

(87) PCT Pub. No.: WO2014/008684
PCT Pub. Date: Jan. 16, 2014

(65) Prior Publication Data
US 2014/0017906 A1    Jan. 16, 2014

(51) Int. Cl.
*H01L 21/203* (2006.01)
*H01L 21/02* (2006.01)
*C23C 14/34* (2006.01)
*C23C 14/54* (2006.01)
*C23C 14/06* (2006.01)
*C23C 14/18* (2006.01)

(52) U.S. Cl.
CPC .......... *H01L 21/02186* (2013.01); *C23C 14/54* (2013.01); *C23C 14/0641* (2013.01); *C23C 14/34* (2013.01); *C23C 14/18* (2013.01)
USPC . 438/776; 438/685; 204/192.15; 204/192.17; 204/290.12; 204/298.02; 204/298.12

(58) Field of Classification Search
CPC .................... H01L 21/02186; C23C 14/0641; C23C 14/18; C23C 14/34; C23C 14/54
USPC ................ 438/776, 685; 204/192.15, 192.17, 204/290.12, 298.02, 298.12
See application file for complete search history.

(56) References Cited

U.S. PATENT DOCUMENTS 4,428,812 A * 1/1984 Sproul ...................... 204/192.15
5,108,569 A * 4/1992 Gilboa et al. ............. 204/192.13
(Continued)

FOREIGN PATENT DOCUMENTS

| CN | 102394218 | * | 3/2012 | ............ H01L 21/203 |
| WO | WO 2009/069150 | * | 6/2009 | .............. C23C 14/06 |
| WO | WO 2011/117916 | * | 9/2011 | .............. C23C 14/34 |

OTHER PUBLICATIONS

English language translation of CN 102394218 A.*
(Continued)

*Primary Examiner* — Mary Wilczewski
(74) *Attorney, Agent, or Firm* — Kinney & Lange, P.A.

(57) ABSTRACT

A method for forming titanium nitride by PVD is disclosed, comprising: generating ions of a noble gas by glow discharge under a vacuum condition that a nitrogen gas and the noble gas are supplied; nitriding a surface of a wafer and a surface of a titanium target with the nitrogen gas; bombarding the surface of the titanium target with the ions of the noble gas after they are accelerated in an electric field so that titanium ions and titanium nitride are sputtered; and forming a titanium nitride layer by depositing titanium nitride on the surface of the wafer in a magnetic field, while titanium ions are injected into the surface of the wafer so that stress is introduced into the titanium nitride layer, wherein non-crystallization fraction of the titanium nitride layer and stress in the titanium nitride layer are increased by increasing kinetic energy of titanium ions which are injected into the surface of the wafer. In the method for forming titanium nitride by PVD according to the present disclosure, kinetic energy of titanium ions which are injected into the surface of the wafer is increased by controlling process parameters so that non-crystallization fraction of the titanium nitride layer and stress in the titanium nitride layer are increased.

10 Claims, 2 Drawing Sheets

(56) References Cited

U.S. PATENT DOCUMENTS

| | | | |
|---|---|---|---|
| 5,455,197 A * | 10/1995 | Ghanbari et al. | 438/685 |
| 5,489,367 A * | 2/1996 | Kubota et al. | 204/192.15 |
| 5,643,422 A * | 7/1997 | Yamada | 204/192.15 |
| 5,798,005 A * | 8/1998 | Murata et al. | 148/421 |
| 5,895,266 A * | 4/1999 | Fu et al. | 438/648 |
| 5,943,601 A * | 8/1999 | Usui et al. | 438/688 |
| 6,028,003 A * | 2/2000 | Frisa et al. | 438/653 |
| 6,132,566 A * | 10/2000 | Hofmann et al. | 204/192.17 |
| 6,156,647 A * | 12/2000 | Hogan | 438/653 |
| 6,238,803 B1 * | 5/2001 | Fu et al. | 428/472 |
| 6,331,811 B2 * | 12/2001 | Shibuya et al. | 338/308 |
| 6,350,685 B1 * | 2/2002 | Asahina et al. | 438/660 |
| 6,420,260 B1 * | 7/2002 | Ngan et al. | 438/627 |
| 6,451,690 B1 * | 9/2002 | Matsumoto et al. | 438/653 |
| 6,593,219 B2 * | 7/2003 | Matsumoto et al. | 438/592 |
| 6,627,056 B2 * | 9/2003 | Wang et al. | 204/298.07 |
| 6,790,323 B2 * | 9/2004 | Fu et al. | 204/192.17 |
| 7,407,565 B2 * | 8/2008 | Wang et al. | 204/192.12 |
| 8,328,585 B2 * | 12/2012 | Herdt et al. | 439/680 |
| 2002/0048636 A1 * | 4/2002 | Matsumoto et al. | 427/383.1 |
| 2003/0141186 A1 * | 7/2003 | Wang et al. | 204/298.07 |
| 2004/0031677 A1 * | 2/2004 | Wang et al. | 204/192.17 |
| 2007/0012558 A1 * | 1/2007 | White et al. | 204/192.1 |
| 2009/0242385 A1 * | 10/2009 | Robison et al. | 204/192.11 |
| 2010/0032842 A1 * | 2/2010 | Herdt et al. | 257/770 |
| 2013/0048489 A1 * | 2/2013 | Yamaguchi et al. | 204/192.15 |
| 2013/0186743 A1 * | 7/2013 | Mizuno | 204/192.12 |
| 2014/0017906 A1 * | 1/2014 | Fu et al. | 438/785 |

OTHER PUBLICATIONS

International Search Report for PCT/CN2012/079176, Apr. 18, 2013, 3 pages.*

* cited by examiner

METHOD FOR FORMING TIN BY PVD

CROSS-REFERENCE TO RELATED APPLICATION

This application is a National Phase application of, and claims priority to, PCT Application No. PCT/CN2012/079176, filed on Jul. 26, 2012, entitled "Method for Forming TiN by PVD", which in turn claims priority to the Chinese Patent Application No. 201210245146.3, filed on Jul. 13, 2012. Both the PCT Application and Chinese Application are incorporated herein by reference in their entireties.

TECHNICAL FIELD

The present disclosure relates to a method form manufacturing a semiconductor device, and particularly to a method for forming a TiN film by PVD.

BACKGROUND

With continuous development of large-scale integrated circuits, an integration level of integrated circuits is continuously increased and a feature size of MOSFETs is decreased beyond the 22 nm node. Actually, it becomes more and more difficult to fulfill the requirement of Moor law after the 90 nm node by simply reducing a gate length. When the gate length is reduced, heavily doping is performed in a channel region for suppressing short channel effects, which, however, causes scattering due to the channel doping and a strong field effect and increased parasitic resistance. Consequently, mobility of carriers in the channel region is decreased, which impairs improvement of electrical performances of the device. In view of this, stress engineering is proposed as a important approach to increasing mobility of carriers in the channel region.

Such an approach utilizes various sources of stress to apply stress to the channel region in the manufacture of the device, such as strained overlayers, stress memorization, and embedded SiGe (eSiGe). The stress, if being appropriately applied, will increase mobility of carriers in the channel region and improve electrical performances of the device even in a case that a size of the channel region is continuously reduced.

A metal gate is widely used in a CMOS device after the 45 nm node. As an extension of SMT technique, an approach of introducing the stress to the channel region by the metal gate is proposed as required, especially for an NMOS device. Thus, it is a necessary task to study the NMOS device with TiNx as a material of the metal gate and to study its stress effect.

Conventional methods for forming a TiN film, such as evaporation, (magnetron) sputtering, PECVD, etc., may obtain a TiNx film with 1 to 2 GPa stress by controlling process parameters. However, with continuous reduction of the device size, a demand on increasing carrier mobility in the channel region is increased. It is difficult for the conventional methods for forming the TiNx film as described above to fulfill the requirement for increasing driving capability of the device by varying process parameters.

SUMMARY OF THE DISCLOSURE

One object of the present disclosure is to increase stress by optimizing process parameters of a method for forming a TiN film by PVD so as to increase mobility of carriers in a channel region and in turn to improve performances of the device.

To this end, there is provided a method for forming titanium nitride by PVD is disclosed, comprising: generating ions of a noble gas by glow discharge under a vacuum condition that a nitrogen gas and the noble gas are supplied; nitriding a surface of a wafer and a surface of a titanium target with the nitrogen gas; bombarding the surface of the titanium target with the ions of the noble gas after they are accelerated in an electric field so that titanium ions and titanium nitride are sputtered; and forming a titanium nitride layer by depositing titanium nitride on the surface of the wafer in a magnetic field, while titanium ions are injected into the surface of the wafer so that stress is introduced into the titanium nitride layer, wherein non-crystallization fraction of the titanium nitride layer and stress in the titanium nitride layer are increased by increasing kinetic energy of titanium ions which are injected into the surface of the wafer.

Preferably, increasing kinetic energy of titanium ions which are injected into the surface of the wafer may comprise: reducing a distance between the wafer and the titanium target.

Preferably, a distance between the wafer the titanium target may be about 190 mm-260 mm.

Preferably, increasing kinetic energy of titanium ions which are injected into the surface of the wafer may comprises: increasing sputtering power. Preferably, the sputtering power may be about 100 w to 2000 w.

Preferably, a flow rate of nitrogen gas may also be increased. Preferably, the flow rate of the nitrogen gaps may be about 1.5 to 10.0 SCCM.

Preferably, a thickness of the titanium nitride layer may also be decreased. Preferably, the thickness of the titanium nitride layer may be about 6 to 100 nm.

Preferably, stress in the titanium nitride layer may be about 0 to −6.5 GPa.

In the method for forming titanium nitride by PVD according to the present disclosure, kinetic energy of titanium ions which are injected into the surface of the wafer is increased by controlling process parameters so that non-crystallization fraction of the titanium nitride layer and stress in the titanium nitride layer are increased.

BRIEF DESCRIPTION OF THE DRAWINGS

The solutions according to the present disclosure will be described in detail with reference to the drawings, in which.

DETAILED DESCRIPTION

Technical features and effects of the solutions of the present disclosure, which are directed to methods for forming TiNx by PVD, will be described below in detail with reference to attached drawings. It should be noted that similar reference numbers denote similar structures. The words "first", "second", "upper", and "lower" may be used in the present application for describing various structures of the device and various steps of the process. However, these words do not imply any spatial, sequential or hierarchy relation of various structures of the device and various steps of the process, unless the context clearly indicates otherwise.

The present disclosure may be implemented by forming TiNx in conventional (magnetron) sputtering apparatus It should be noted that titanium nitride is sometimes referred to as "TIN" for simplicity in the context of the present application. That is, the content x of N is omitted. However, it does not mean that the content x should be exactly the integer "1". Actually, the content x may be any number from 0 to 4 and may not be limited to an integer.

Figure 1:
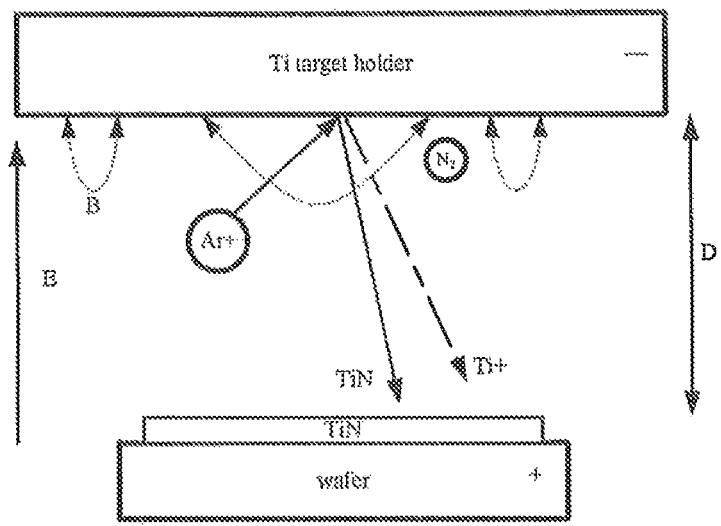
FIG. 1 schematically shows a method for depositing a TiN film by sputtering in an embodiment according to the present disclosure.

As shown in FIG. 1, ions of a noble gas (He, Ne, Ar, Kr, Xe etc., preferably Ar, and atoms with larger atomic weight to improve bombarding and sputtering effects) are generated during ionization by glow discharge of the noble gas under a vacuum condition that a reactive gas (i.e. nitrogen gas) and a sputtering gas (i.e. the noble gas) are supplied. For example, chamber pressure during sputtering is maintained at about 8 mtorr. Meanwhile, a surface of the Ti target and a surface of a wafer (for example, a monocrystalline Si wafer) are nitrided by nitrogen gas. The ions of the noble gas are accelerated in an electric field and bombard the surface of the Ti target to sputter atoms of TIN. Due to the electric field, the atoms of TIN reach the wafer and are deposited as a TiN film. In the above process, the noble gas such as Ar or the like, in addition to the atoms of TiN that reach the wafer, will also bombard the surface of the Ti target to sputter Ti ions. The Ti ions on one hand react with the nitrogen gas, and one the other hand continuously bombard the TIN film which has already been formed on the wafer so that the TiN film on the surface of the wafer is locally non-crystallized and is thus introduced with stress.

The inventor proposes a key solution of the present disclosure on the basis of theoretical analysis and many times of experiments for verifying the theoretical analysis. The key solution is that non-crystallization fraction of the TiN and stress in the TIN may be increased by increasing kinetic energy of Ti ions which are injected into the surface of the wafer.

Figure 2:
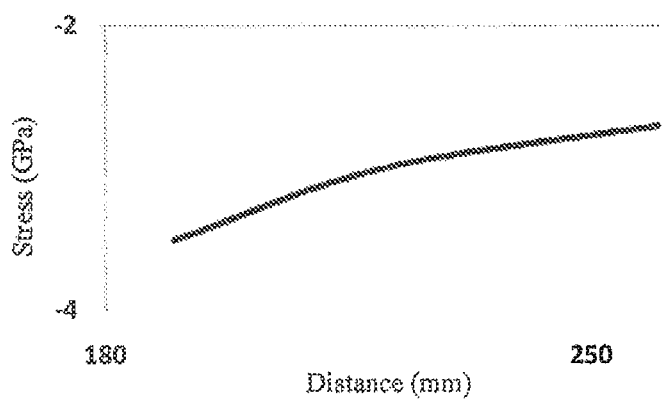
FIGS. 2 to 5 are graphs showing stress in the TiNx film versus a distance between a target and a wafer, power, a flow rate, and a thickness, respectively.

Specifically, the kinetic energy of Ti ions which are injected into the surface of the wafer may be increased by:

1) shortening a distance D between the wafer and the target holder in FIG. 1. In a conventional sputtering chamber, the distance D is typically 260 mm. As a comparison, the distance is decreased to about 190 mm in an embodiment according to the present disclosure. Due to a shorter distance, an electric filed is enhanced even at the same voltage. As a result, the Ti ions are accelerated more in the electric field so that the non-crystallization fraction of the TiN film on the surface of the wafer is remarkably increased, which in turn effectively increases the stress in the TiN film, It is apparent from FIG. 2 that the stress in the TiN film is remarkably increased with a shorter distance in the range of 190 mm to 260 mm. Thus, the distance D should be shortened as much as possible.

Figure 3:
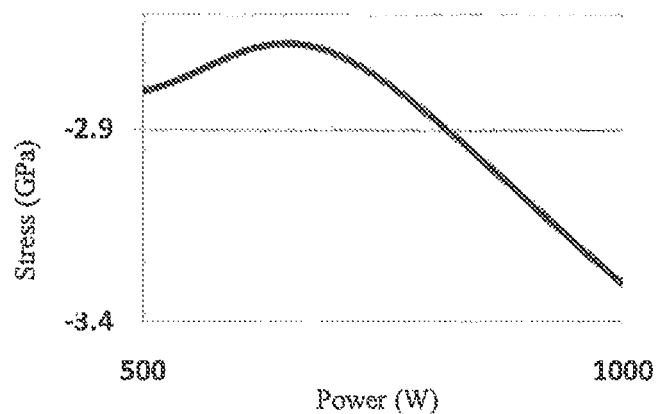

2) increasing sputtering power. In a conventional sputtering chamber, the sputtering power is typically 50 to 200 w. As a comparison, the sputtering power is increased in the method according to the present disclosure. For example, the sputtering power is in the range of about 100 w to 2000 w, and preferably in the range of about 800 w to 2000 w, and more preferably in the range of about 1500 w to 2000 w. It is apparent from FIG. 3 that the electromagnetic field is enhanced even at the same distance when the sputtering power is increased in the range of about 100 w to 2000 w, and the TiN ions have larger kinetic energy. As a result, the non-crystallization fraction of TIN is increased, which in turn increases the stress in the film. Thus, the sputtering power should be increased as much as possible.

Figure 4:
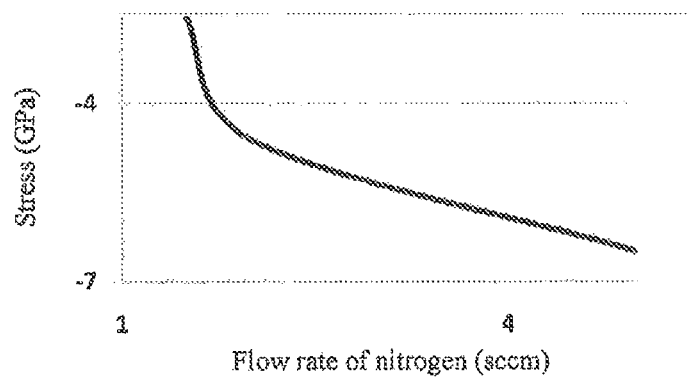

Moreover, the stress in the film may be increased by increasing a flow rate of nitrogen gas in the method according to the present disclosure. It is apparent from FIG. 4 that the stress in the film is increased with an increased flow rate of nitrogen gas. This is because a larger content of N in TiN varies crystal lattice of the film, which in turn increases intrinsic stress. Preferably, the flow rate of nitrogen gas in the present disclosure may be about 1.5 to 10.0 SCCM, more preferably about 3.0 to 10.0 SCCM, and most preferably about 7.5 to 10.0 SCCM.

Figure 5:
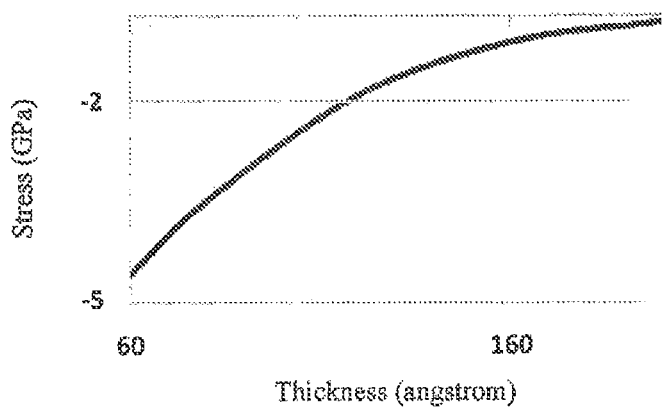

It is apparent from FIG. 5 that stress in TIN is remarkably increased when a thickness of the resultant TiN film on the wafer is decreased. This is because fine cracks in crystal lattice of the TIN film with a small thickness propagate into a larger relative depth with respect to the thickness of the TIN film, even in a case that kinetic energy of Ti ions is the same. That is, the non-crystallization fraction of TiN film due to bombardment of Ti ions is increased, which in turn increases the local stress in the filmln an embodiment according to the present disclosure, the thickness of the TIN film may be 6 to 100 nm. preferably 6 to 50 nm, and more preferably 6 to 10 nm.

In summary, as shown in FIGS. 2 to 5, the stress of the resultant TIN film may be as large as −6.5 GPa, for example in the range of +1.0 to −6.5 Gpa, and preferably in the range of 0 to −6.5 GPa, by optimizing various process parameters. The stress is much larger than the stress (±2 GPa at most) achieved in conventional PECVD magnetron sputtering processes.

In the method for forming titanium nitride by PVD according to the present disclosure, kinetic energy of titanium ions which are injected into the surface of the wafer is increased by controlling process parameters so that non-crystallization fraction of the titanium nitride layer and stress in the titanium nitride layer are increased.

The present disclosure has been described above with reference to one or more embodiments thereof. It should be understood that various modifications, alternations and additions can be made to the device structure by one skilled person in the art without departing from the spirits and scope of the present disclosure. Moreover, the teachings of the present disclosure may make various modifications which may be adapted for particular situations or materials without departing from the spirits and scope of the present disclosure. Therefore, the object of the present disclosure is not limited to the above particular embodiments as preferably implementations of the present disclosure. The device structure and the manufacture method thereof as disclosed will include all of embodiments falling within the scope of the present disclosure.

We claim:

1. A method for forming titanium nitride by PVD, comprising:
    generating ions of a noble gas by glow discharge under a vacuum condition that a nitrogen gas and the noble gas are supplied;
    nitriding a surface of a wafer and a surface of a titanium target with the nitrogen gas;
    bombarding the surface of the titanium target with the ions of the noble gas after they are accelerated in an electric field so that titanium ions and titanium nitride are sputtered; and
    forming a titanium nitride layer by depositing titanium nitride on the surface of the wafer in a magnetic field while titanium ions are injected into the surface of the wafer so that stress is introduced into the titanium nitride layer,
    wherein non-crystallization fraction of the titanium nitride layer and stress in the titanium nitride layer are increased by increasing kinetic energy of titanium ions which are injected into the surface of the wafer.

2. The method according to claim 1, wherein increasing kinetic energy of titanium ions which are injected into the surface of the wafer comprises: decreasing a distance between the wafer and the titanium target.

3. The method according to claim 2, wherein the distance between the wafer and the titanium target is about 190 mm to 260 mm.

4. The method according to claim 1, wherein increasing kinetic energy of titanium ions which are injected into the surface of the wafer comprises: increasing sputtering power.

5. The method according to claim 4, wherein the sputtering power is about 100 w to 2000 w.

6. The method according to claim 1, further comprising increasing a flow rate of nitrogen gas.

7. The method according to claim 6, wherein the flow rate of nitrogen gas is about 1.5 to 10.0 SCCM.

8. The method according to claim 1, further comprising decreasing a thickness of the titanium nitride layer.

9. The method according to claim 8, wherein the thickness of the titanium nitride layer is about 6 to 100 nm.

10. The method according to claim 1, wherein the stress in the titanium nitride layer is about 0 to −6.5 GPa.

* * * * *